United States Patent
Nakayama et al.

(10) Patent No.: US 11,037,993 B2
(45) Date of Patent: Jun. 15, 2021

(54) DETECTION DEVICE AND DETECTOR

(71) Applicant: KABUSHIKI KAISHA TOSHIBA, Minato-ku (JP)

(72) Inventors: Kohei Nakayama, Kawasaki (JP); Fumihiko Aiga, Kawasaki (JP); Atsushi Wada, Kawasaki (JP); Isao Takasu, Setagaya (JP); Yuko Nomura, Kawasaki (JP); Sara Yoshio, Yokohama (JP); Rei Hasegawa, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 29 days.

(21) Appl. No.: 16/804,416

(22) Filed: Feb. 28, 2020

(65) Prior Publication Data

US 2020/0395415 A1     Dec. 17, 2020

(30) Foreign Application Priority Data

Jun. 17, 2019   (JP) .............................. JP2019-112012

(51) Int. Cl.
| | |
|---|---|
| *H01L 27/30* | (2006.01) |
| *G01T 1/24* | (2006.01) |
| *H01L 51/44* | (2006.01) |
| *H01L 51/42* | (2006.01) |

(52) U.S. Cl.
CPC ............ *H01L 27/308* (2013.01); *G01T 1/241* (2013.01); *H01L 27/305* (2013.01);
(Continued)

(58) Field of Classification Search
CPC ..... H01L 27/14; H01L 27/144; H01L 27/146; H01L 27/14601; H01L 27/14643;
(Continued)

(56) References Cited

U.S. PATENT DOCUMENTS

2013/0069050 A1 *  3/2013  Laurent ............... H01L 51/5088
                                                            257/40
2014/0225094 A1    8/2014  Fraboni et al.
(Continued)

FOREIGN PATENT DOCUMENTS

JP    2012-015434 A    1/2012
JP    2013-089685 A    5/2013
(Continued)

OTHER PUBLICATIONS

Goldan et al., "Unipolar time-differential pulse response with a solid-state Charpak photoconductor", Applied Physics Letter, 101, 213503, 2012, 6 pages.

*Primary Examiner* — Cheung Lee
(74) *Attorney, Agent, or Firm* — Oblon, McClelland, Maier & Neustadt, L.L.P.

(57) ABSTRACT

A detection device according to an embodiment of the present disclosure includes a plurality of semiconductor layers, each including a plurality of electrode regions and a semiconductor region. The plurality of electrode regions are: arranged at intervals in a cross direction crossing a thickness direction; configured to generate electric charges by a photoelectric effect of irradiation of radiation; and configured to produce an electric field in the cross direction by voltage application. The semiconductor region is provided at least between the electrode regions adjacent to one another in the cross direction. The plurality of semiconductor layers are stacked in the thickness direction.

15 Claims, 5 Drawing Sheets

(52) U.S. Cl.
CPC ........ *H01L 51/4253* (2013.01); *H01L 51/441* (2013.01); *H01L 27/30* (2013.01); *H01L 51/424* (2013.01); *H01L 51/442* (2013.01)

(58) Field of Classification Search
CPC . H01L 27/14645; H01L 27/30; H01L 27/301; H01L 27/305; H01L 37/307; H01L 27/308; H01L 51/42; H01L 51/424; H01L 51/4253; H01L 51/44; H01L 51/441; H01L 51/442; G01T 1/24; G01T 1/241; G01T 1/242; G01T 1/243
See application file for complete search history.

(56) References Cited

U.S. PATENT DOCUMENTS

| | | | |
|---|---|---|---|
| 2015/0014627 A1* | 1/2015 | Yu | H01L 31/046 257/13 |
| 2015/0263303 A1* | 9/2015 | Kudenov | H01L 27/305 136/256 |
| 2018/0267180 A1* | 9/2018 | Sugi | H01L 51/4253 |
| 2018/0277607 A1* | 9/2018 | Takasu | G01T 1/24 |
| 2019/0265370 A1 | 8/2019 | Nakayama et al. | |
| 2020/0091452 A1 | 3/2020 | Nakayama | |

FOREIGN PATENT DOCUMENTS

| | | |
|---|---|---|
| JP | 2014-529728 A | 11/2014 |
| JP | 2018-155580 A | 10/2018 |
| JP | 2019-145751 A | 8/2019 |
| JP | 2020-41980 | 3/2020 |

* cited by examiner

DETECTION DEVICE AND DETECTOR

CROSS-REFERENCE TO RELATED APPLICATIONS

This application is based upon and claims the benefit of priority from Japanese Patent Application No. 2019-112012, filed on Jun. 17, 2019; the entire contents of which are incorporated herein by reference.

FIELD

Embodiments described herein relate generally to a detection device and a detector.

BACKGROUND

A radiation detection device with a semiconductor layer has been known. The detection device detects the radiation by converting energy of the radiation into energy of the electric charges in the semiconductor layer and generating electric currents as an output signal. With regard to such a detection device, a configuration has been known, in which a thickness of the semiconductor layer is increased to improve detection efficiency of the radiation such as X-rays and γ-rays with higher transmissivity to the semiconductor layer.

DETAILED DESCRIPTION

Figure 1:
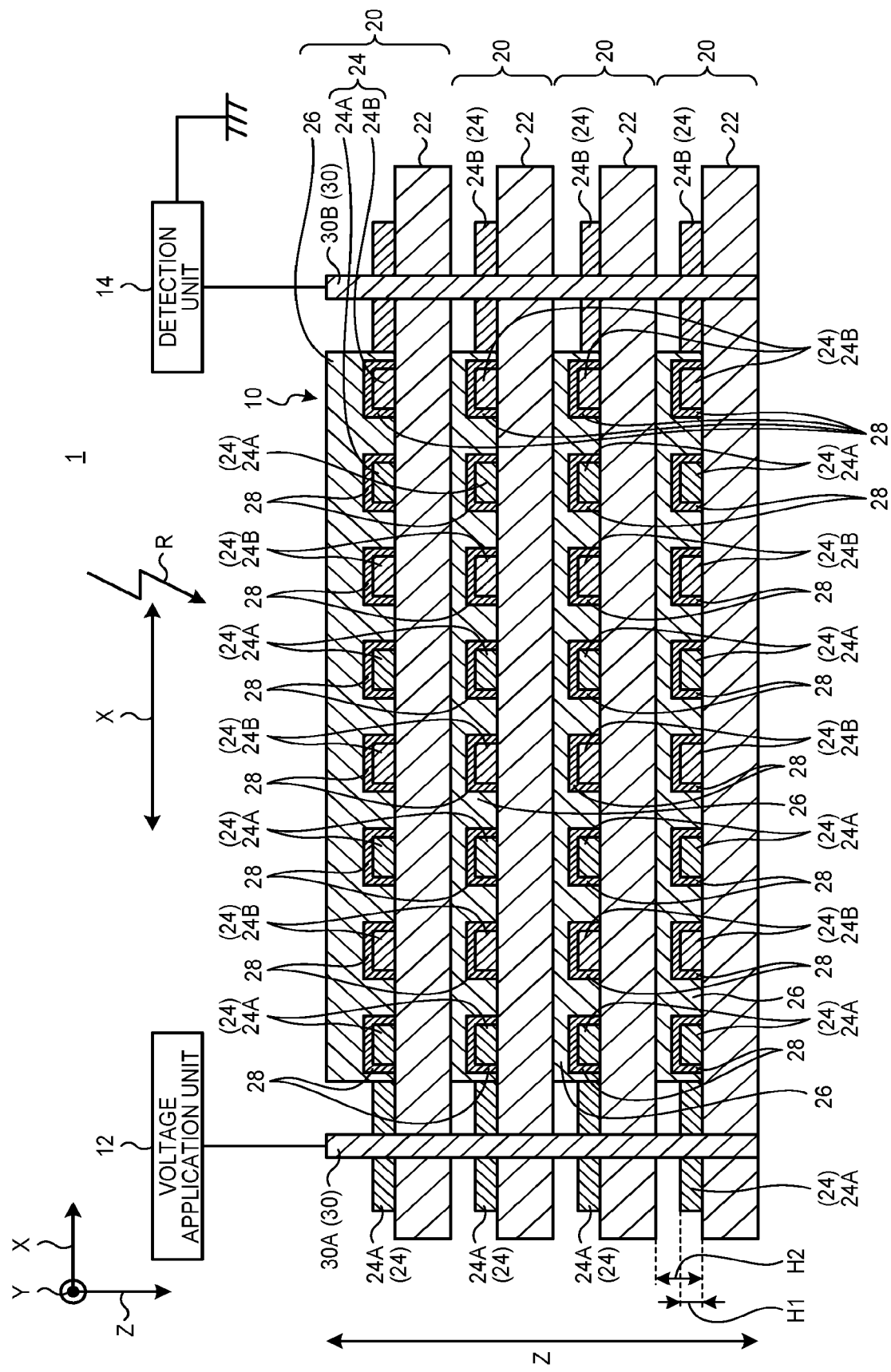
FIG. 1 is a schematic diagram of a detector.

A detection device according to an embodiment of the present disclosure includes a plurality of semiconductor layers, each including a plurality of electrode regions and a semiconductor region. The plurality of electrode regions is: arranged at intervals in a cross direction crossing a thickness direction; configured to generate electric charges by a photoelectric effect of irradiation of radiation; and configured to produce an electric field in the cross direction by voltage application. The semiconductor region is provided at least between the electrode regions adjacent to one another in the cross direction. The plurality of semiconductor layers are stacked in the thickness direction.

Details of the present embodiment will be described below with reference to the accompanying drawings. In the present specification, the same members or portions having the same functions are denoted by the same reference numerals, and the description thereof may be omitted.

First Embodiment

FIG. 1 is a schematic diagram illustrating an example of a detector 1 of the present embodiment.

The detector 1 is an apparatus configure to detect radiation R. In the present embodiment, the detector 1 particularly detects electromagnetic radiation contained in radiation R. The electromagnetic radiation is high-energy electromagnetic waves (for example, electromagnetic waves having a frequency exceeding 30,000 trillion hertz). Specifically, the electromagnetic radiation is X-rays and γ-rays.

The detector 1 includes a detection device 10, a voltage application unit (voltage application circuit) 12, and a detection unit (detection circuit) 14. The detection device 10, the voltage application unit 12, and the detection unit 14 are electrically connected.

The detection device 10 is a stacked body of a plurality of semiconductor layers 20. Those semiconductor layers 20 are stacked in a thickness direction Z of the semiconductor layer 20. The thickness direction Z is a layer thickness direction of the semiconductor layer 20, as illustrated in FIG. 1.

The semiconductor layer 20 includes a substrate 22, electrode regions 24, a semiconductor region 26, and insulating regions 28.

The substrate 22 is a member that can support components other than the substrate 22 in the detection device 10. The substrate 22 can be made of a material that transmits the radiation R and can support the components. The transmitting of the radiation R means that 50% or more, preferably 80% or more of the incident radiation R is transmitted. For example, the substrate 22 is, for example, a polymer film, but is not limited thereto.

Each of the electrode regions 24 has conductivity and generates electric charges by a photoelectric effect of irradiation of the radiation R. The electrode region 24 is electrically connected to the voltage application unit 12 and the detection unit 14 (described later) via through-electrodes 30 that penetrate the plurality of semiconductor layers 20 in the thickness direction Z. Thus, the electrode region 24 functions as an electrode.

A plurality of electrode regions 24 is arranged at intervals in a cross direction X. The electrode regions 24 produce an electric field in the cross direction X by the voltage application. That is, the electric field in the cross direction X is produced between the adjacent electrode regions 24 arranged at an interval in the cross direction X by applying a voltage to those electrode regions 24.

The cross direction X is a direction crossing the thickness direction Z, as illustrated in FIG. 1. In other words, the cross direction X is a direction along a two-dimensional plane (an X-Y plane in FIG. 1) crossing the thickness direction Z of the semiconductor layer 20. In the present embodiment, an example in which the cross direction X is a direction orthogonal to the thickness direction Z, and in which a direction Y (Y-axis direction) is a direction orthogonal to the cross direction X and the thickness direction Z, will be described.

In the present embodiment, the plurality of electrode regions 24 is arranged on the two-dimensional plane (X-Y plane) of the flat substrate 22, to which the radiation R is incident, at intervals in the cross direction X.

The intervals between the plurality of electrode regions 24 arranged in the cross direction X within the semiconductor layer 20 can be all the same or can be partially different. The intervals between the plurality of electrode regions 24 in the cross direction X are preferably the same within the semiconductor layer 20 from the viewpoint of suppressing intensity variations of output signals output from these electrode regions 24 in the cross direction X.

Widths (lengths in the cross direction X) of the plurality of electrode regions 24 arranged at the intervals in the cross direction X can be all the same or partially different within the semiconductor layer 20. From the viewpoint of suppressing the intensity variations of the output signals output from these electrode regions 24 in the cross direction X, the lengths of the plurality of electrode regions 24 in the cross direction X are preferably all the same.

The electrode regions 24 include a first electrode region 24A and a second electrode region 24B. The electrode regions 24 are configured such that the first electrode region 24A and the second electrode region 24B are alternately arranged at the intervals in the cross direction X.

Voltages having different potentials are applied to the first electrode region 24A and the second electrode region 24B by the voltage application unit 12 described later. Thus, in a state in which the voltages are applied, the first electrode region 24A and the second electrode region 24B have different potentials.

For example, a voltage having a higher potential is applied to the first electrode region 24A than the second electrode region 24B. Alternatively, a voltage having higher potential can be applied to the second electrode region 24B than the first electrode region 24A. In the present embodiment, the example in which a voltage (bias voltage) having a higher potential is applied to the first electrode region 24A than the second electrode region 24B will be described.

The first electrode region 24A and the second electrode region 24B may have different potentials, and can be alternately arranged at the interval in the cross direction X. The connection form of the plurality of first electrode regions 24A and the plurality of second electrode regions 24B is not limited.

For example, the first electrode region 24A and the second electrode region 24B can be in a line pattern continuous along the two-dimensional plane (X-Y plane) in the cross direction X.

Figure 2:
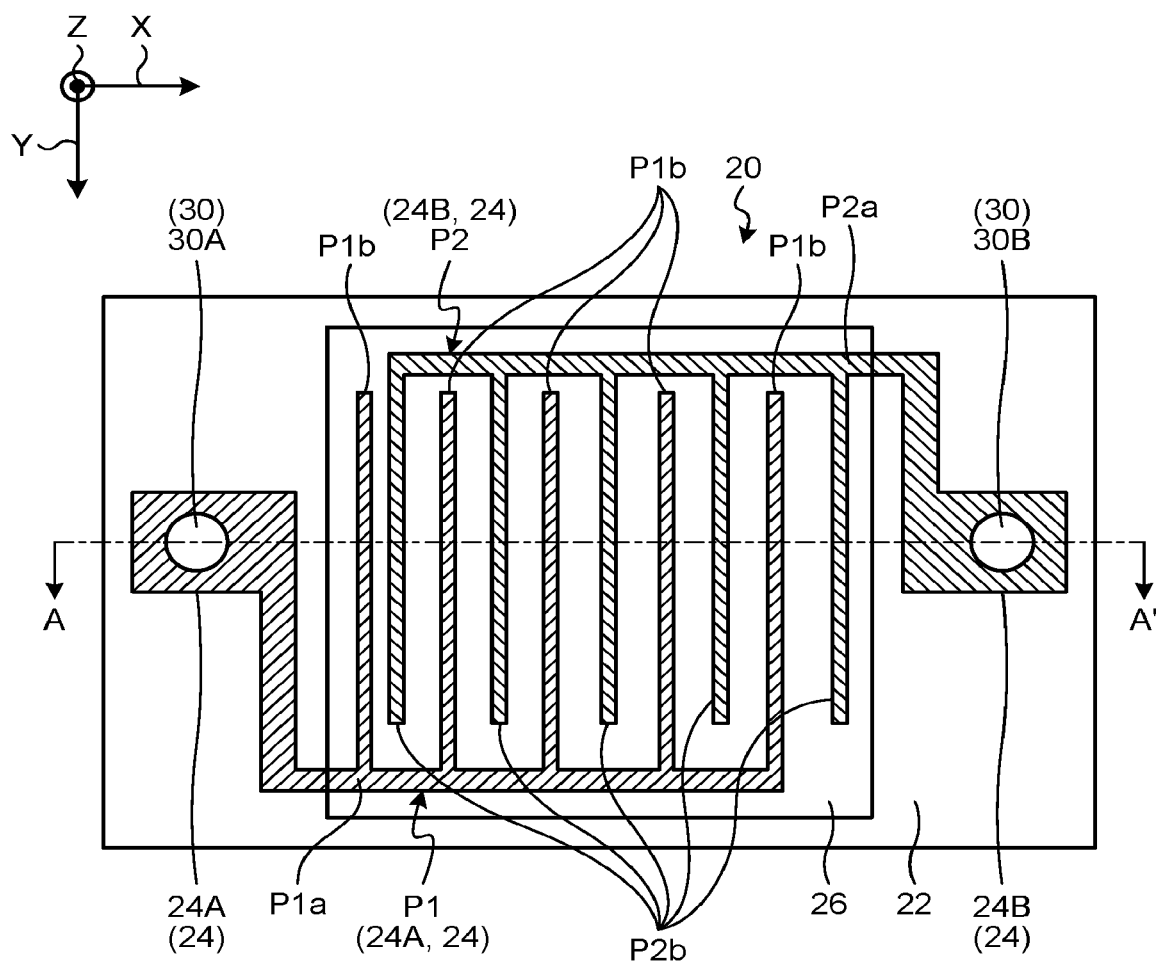
FIG. 2 is a plane view of a semiconductor layer.

FIG. 2 is an example of a plane view of the semiconductor layer 20. A cross section A-A' of FIG. 2 corresponds to FIG. 1.

As illustrated in FIG. 2, the first electrode region 24A is a first electrode line pattern P1 that is continuous along the two-dimensional plane (X-Y plane). The first electrode line pattern P1 can be a pattern in which at least part of the electrode region 24 is alternately arranged in the cross direction X at the interval from the second electrode region 24B.

The first electrode line pattern P1 includes, for example, a line region P1a and a plurality of line regions P1b.

The line region P1a is a line-shaped electrode region 24 that has one end in the cross direction X electrically connected to a first through-electrode 30A, and that extends in the cross direction X on the two-dimensional plane (X-Y plane) of the substrate 22. The line regions P1b are a plurality of line-shaped electrode regions 24 that extends along the two-dimensional plane (X-Y plane) from the line region P1a in the Y direction orthogonal to the cross direction X on the two-dimensional plane (X-Y plane), and that is arranged at intervals in the cross direction X. Thus, in the case of this configuration, the plurality of line regions P1b is regions alternately arranged in the cross direction X at intervals from the second electrode region 24B.

Similarly, the second electrode region 24B is a second electrode line pattern P2 continuous along the two-dimensional plane (X-Y plane). The second electrode line pattern P2 can be any pattern in which at least part of the electrode region 24 is alternately arranged in the cross direction X at an interval from the first electrode region 24A.

The second electrode line pattern P2 includes, for example, a line region P2a and a plurality of line regions P2b.

The line region P2a is a line-shaped electrode region 24 that has one end in the cross direction X electrically connected to a second through-electrode 30B, and that extends in the cross direction X along the two-dimensional plane (X-Y plane) of the substrate 22. The line regions P2b is a plurality of line-shaped electrode regions 24 that extends along the two-dimensional plane (X-Y plane) from the line region P2a toward the Y direction orthogonal to the cross direction X of the two-dimensional plane (X-Y plane), and that is arranged at intervals in the cross direction X. Thus, in the case of this configuration, the plurality of line regions P2b is regions alternately arranged in the cross direction X at an interval from the first electrode region 24A which is the line region P1b.

A constituent material of each electrode region 24 can be any material that has conductivity and generates electric charges by a photoelectric effect of irradiation of the radiation R.

The constituent material of the electrode region 24 is, for example, a heavy element or an alloy of a heavy element. Specifically, the electrode region 24 is at least one selected from a group consisting of heavy elements such as bismuth, lead, gold, and tungsten, or an alloy thereof. Among those materials, gold, bismuth, or a bismuth alloy is preferably used as the constituent material of the electrode region 24 from the viewpoint of radiation absorption and conductivity.

The first electrode region 24A and the second electrode region 24B can be made of the same constituent material, or can be made of constituent materials which are at least partially different. Note that at least part of the constituent materials of the first electrode region 24A and the second electrode region 24B is preferably different. Specifically, out of the first electrode region 24A and the second electrode region 24B, the one to which the bias voltage is applied from the voltage application unit 12 preferably includes a material that easily emits electrons, or has a surface made of a material that easily emits electrons.

Referring back to FIG. 1, the description will be continued.

The semiconductor region 26 will be described. The semiconductor region 26 is a semiconductor region for carrying electric charges generated at the electrode region 24 by the irradiation of the radiation R.

The constituent material of the semiconductor region 26 can be any material that has a function of carrying the electric charges and transmits the radiation R. For example, the semiconductor region 26 can be a known compound semiconductor or an organic semiconductor.

For amplifying the electric charges generated from the electrode region 24, the semiconductor region 26 is preferably an organic semiconductor region that converts the energy of the radiation R into the energy of the electric charges.

In this case, from the viewpoint of improving detection accuracy and detection sensitivity of the electromagnetic radiation such as X-rays and γ-rays, the electrode region 24 is preferably configured to convert at least the energy of the electromagnetic radiation such as X-rays and γ-rays contained in the radiation R into the energy of the electric charges. The electrode region 24 is particularly preferably configured to convert the energy of the X-rays or the γ-rays into the energy of the electric charges.

The semiconductor region 26 is, for example, a constituent material having, as a main component, an organic material satisfying the aforementioned condition. The main component means that the content is 70% or more.

Specifically, the semiconductor region 26 is preferably made of a material selected from at least one of a derivative of polyphenylene vinylene (PPV) and a polythiophene polymer material.

The derivative of the polyphenylene vinylene is, for example, poly [2-methoxy, 5-(2'-ethyl-hexyloxy)-p-phenylene-vinylene] (MEH-PPV). The polythiophene polymer material is, for example, a poly (3-alkylthiophene) such as poly-3-hexylthiophene (P3HT) or a dioctylfluorene-bithiophene copolymer (F8T2). The semiconductor region 26 is particularly preferably made of P3HT or F8T2.

The semiconductor region 26 can be a mixture of an organic material and an inorganic material. In this case, for example, the semiconductor region 26 can be a mixture of the organic material with fullerene, a fullerene derivative, a carbon nanotube (CNT) having semiconductivity, and a CNT compound.

The fullerene derivative is, for example, [6, 6]-phenyl-C61-methyl butyrate (PCBM), fullerene dimer, or a fullerene compound into which an alkali metal or an alkaline earth metal is introduced. The CNT is, for example, a carbon nanotube encapsulating fullerene or metal-encapsulated fullerene. The CNT is, for example, a CNT compound in which various molecules are added to a sidewall or a tip of the CNT.

Among those materials, the semiconductor region 26 is preferably made of the P3HT and the fullerene derivative from the viewpoint of amplifying the electric charges.

The semiconductor region 26 is only required to be provided at least between the electrode regions 24 adjacent in the cross direction X. The semiconductor region 26 can be provided so as to fill a space between the electrode regions 24 adjacent to one another in the cross direction X. As illustrated in FIG. 1, the semiconductor region 26 can be arranged so as to continuously cover the space between the electrode regions 24 adjacent to one another in the cross direction X and the plurality of electrode regions 24 adjacent to one another in the cross direction X.

The thickness of the semiconductor region 26 (the length in the thickness direction Z) is not limited. For example, the thickness of the semiconductor region 26 (see a thickness H2 in FIG. 1) is preferably 0.5 times or more and 10 times or less than the thickness of the electrode region 24 (see a thickness H1 in FIG. 1) within the semiconductor layer 20 including the semiconductor region 26, and more preferably 1 time or more and 1.5 times or less.

Next, the insulating region 28 will be described.

The semiconductor layer 20 preferably includes the insulating regions 28. The insulating region 28 is preferably arranged in at least part of a facing surface between the electrode regions 24 adjacent to one another in the cross direction X. In other words, at least part of a surface of the electrode region 24 facing the other electrode region 24 adjacent to one another in the cross direction X is preferably covered by the insulating region 28.

The bias voltage applied to the electrode region 24 can be increased by employing the configuration in which the semiconductor layer 20 includes the insulating regions 28, in comparison with a configuration in which the semiconductor layer does not include the insulating regions 28. Thus, also the signal intensity of the output signal can be increased.

The insulating regions 28 are preferably arranged within the semiconductor region 26 so as to cover each of the plurality of electrode regions 24, as illustrated in FIG. 1.

In the configuration including the insulating regions 28, the semiconductor region 26 can be arranged between the electrode regions 24 via the insulating region 28 arranged on the facing surface between the electrode regions 24 adjacent to one another in the cross direction X.

The insulating region 28 can be made of a material which has an insulating property and does not inhibit the transmission of the radiation R to be detected by the detection device 10. For example, the insulating region 28 is made of polyphenylenselfide (PPS), perfluoroalkoxy alkane (PFA), polytetrafluoroethylene (PTFA), block copolymer (BCP), silicon oxide, aluminum oxide, or boron oxide. Among these materials, an organic insulating material such as PPS is preferably used for reasons of processability.

Next, a stacked configuration of the plurality of semiconductor layers 20 will be described.

As described above, the detection device 10 is the stacked body in which the plurality of semiconductor layers 20 is stacked in the thickness direction Z. The number of stacked semiconductor layers 20 in the detection device 10 is two or more. Note that, from the viewpoint of improving the detection accuracy of the electromagnetic radiation, the number of stacked semiconductor layers 20 in the detection device 10 is preferably three or more.

The electrode regions 24 arranged within one semiconductor layer 20 are preferably arranged in a single layer in the thickness direction Z of the corresponding semiconductor layer 20.

The intervals between the electrode regions 24 in the cross direction X between the semiconductor layers 20 stacked in the thickness direction Z, the positions of the electrode regions 24, and the sizes of the electrode regions 24 can be different, but are preferably the same as each other.

The positions of the electrode regions 24 between the semiconductor layers 20 stacked in the thickness direction Z are preferably the same in a plane view. A case where "the positions are the same in a plane view" means that the positions where the detection device 10 is viewed in the thickness direction Z are the same. In other words, a case where the positions are the same in the plane view means that positions represented by two-dimensional coordinates of an X-Y two-dimensional plane are the same.

The thicknesses, the arrangement, and the constituent materials of each of the electrode regions 24, the semiconductor regions 26, and the insulating regions 28 between the semiconductor layers 20 stacked in the thickness direction Z are preferably the same in at least the same detection unit region. The detection unit region is each region obtained by dividing the detection device 10 into a plurality of regions along the X-Y plane, and is a detection unit region. The detection unit region corresponds to, for example, a pixel region for one pixel.

From the viewpoint of suppressing occurrence of a potential difference between the plurality of semiconductor layers 20 stacked in the thickness direction Z, the thicknesses, the arrangement, and the constituent materials of each of the electrode regions 24, the semiconductor regions 26, and the insulating regions 28 between the semiconductor layers 20 are preferably the same.

The shapes and positional relationships of the first electrode line pattern P1 and the second electrode line pattern P2, which are the electrode regions 24, between the plurality of semiconductor layers 20 stacked in the thickness direction Z are preferably the same.

As described above, the first electrode region 24A and the second electrode region 24B have different potentials within one semiconductor layer 20 by the voltage application. Meanwhile, the potentials of the electrode regions 24 arranged at an overlapping position in a plane view between the plurality of semiconductor layers 20 stacked in the thickness direction Z are preferably the same potential. The overlapping position in a plane view has the same meaning as "the positions are the same in a plane view" described above. Therefore, the potentials of the electrode regions 24 arranged at the same position in the plane view are the same between the semiconductor layers 20.

Next, the voltage application unit 12 will be described.

The voltage application unit 12 applies the voltages to the electrode regions 24 of each of the plurality of semiconductor layers 20 stacked in the thickness direction Z in the detection device 10.

Specifically, the voltage application unit 12 applies the voltages to, for example, the first through-electrode 30A and the second through-electrode 30B. The voltages are applied to the first electrode region 24A of each of the plurality of semiconductor layers 20 electrically connected to the first through-electrode 30A and the second electrode region 24B of each of the plurality of semiconductor layers 20 electrically connected to the second through-electrode 30B.

Either the first electrode region 24A or the second electrode region 24B is grounded. In the present embodiment, an example in which the second electrode region 24B is grounded via the second through-electrode 30B will be described. In the present embodiment, the voltage application unit 12 applies the bias voltage to the first through-electrode 30A, thereby applying the bias voltage to the first electrode region 24A.

The voltage application unit 12 applies the voltages to the electrode regions 24 such that the potentials of the plurality of electrode regions 24 adjacent to one another in the cross direction X have different values in each of the plurality of semiconductor layers 20 stacked in the thickness direction Z.

For more detail, the voltage application unit 12 applies the voltages such that the first through-electrode 30A and the second through-electrode 30B have different potentials. In the present embodiment, the second through-electrode 30B is grounded. The voltage application unit 12 applies the voltage to the first through-electrode 30A so as to have a potential different from the potential of the second through-electrode 30B.

Accordingly, the voltages are applied to the first electrode region 24A and the second electrode region 24B in each of the plurality of semiconductor layers 20 stacked in the thickness direction Z so as to have different potentials. For example, the voltage application unit 12 applies the bias voltage to the first through-electrode 30A connected to the first electrode region 24A such that the potential of the first electrode region 24A is higher than the potential of the second electrode region 24B.

The first electrode region 24A and the second electrode region 24B in each of the plurality of semiconductor layers 20 have different potentials by the voltage application.

The voltage application unit 12 preferably applies the voltages to the electrode regions 24 such that the electrode regions 24 arranged at the overlapping position in the plane view between the plurality of semiconductor layers 20 stacked in the thickness direction Z have the same potential.

As described above, the first through-electrode 30A is the through-electrode 30 that penetrates the plurality of semiconductor layers 20 in the thickness direction Z, and is electrically connected to the first electrode region 24A of each of the plurality of semiconductor layers 20. The second through-electrode 30B is the through-electrode 30 that penetrates the plurality of semiconductor layers 20 in the thickness direction Z, and is electrically connected to the second electrode region 24B of each of the plurality of semiconductor layers 20.

The voltage application unit 12 applies the bias voltage to the first through-electrode 30A and grounds the second through-electrode 30B. With this configuration, the voltage application unit 12 applies the voltages to the electrode regions 24 such that the electrode regions 24 arranged at the overlapping position in the plane view between the plurality of semiconductor layers 20 stacked in the thickness direction Z have the same potential.

The detection unit 14 detects output signals output from the electrode regions 24 of each of the plurality of semiconductor layers 20.

The output signal is a signal representing the amount of electric charges converted by the semiconductor layer 20. The magnitude of the output signal corresponds to the detection energy of the radiation R detected in the semiconductor layer 20. The electrode region 24 obtains the output signal by converting the amount of electric charges detected at the semiconductor layer 20 into a signal measurable by a charge amplifier or a current-voltage conversion amplifier.

In the present embodiment, an example in which the detection unit 14 receives the output signal from the second electrode region 24B via the second through-electrode 30B will be described. The detection unit 14 can be configured to receive the output signal from the first electrode region 24A via the first through-electrode 30A.

The detection unit 14 derives the detection energy of the radiation R based on the received output signal. A known method can be used in order to derive the detection energy.

Method of Manufacturing Detector

Next, an example of a method of manufacturing the detector 1 will be described. The method of manufacturing the detector 1 is not limited. For example, the detector 1 can be manufactured by the following procedure.

Firstly, the semiconductor layer 20 is manufactured. Specifically, the electrode region 24 is formed on the substrate 22. For example, a polymer film is used as the substrate 22. For example, the first electrode line pattern P1 and the second electrode line pattern P2 made of bismuth or a bismuth alloy are formed on the substrate 22. Through-holes penetrating through the substrate 22, the first electrode line pattern P1, and the second electrode line pattern P2 are formed at end portions of the first and second electrode line patterns P1 and P2 in the cross direction X. After the insulating region 28 is formed on the first electrode line pattern P1 and the second electrode line pattern P2, the constituent material of the semiconductor region 26 is deposited. Through these processes, one semiconductor layer 20 is manufactured. The plurality of semiconductor layers 20 is manufactured in this manner.

The stacked body in which the plurality of manufactured semiconductor layers 20 is stacked in the thickness direction Z is manufactured. At this time, alignment is performed such that the positions of the through-holes of the semiconductor layers 20 are the same in the plane view, and then the stacked body is manufactured. The through-electrodes 30 (the first through-electrode 30A and the second through-electrode 30B) are manufactured by filling the through-holes with a conductive material using solder. Through this process, the electrode regions 24 of the plurality of semiconductor layers 20 are electrically connected to each of the first electrode region 24A and the second electrode region 24B.

The detection device 10 is manufactured by the aforementioned process.

Subsequently, the first through-electrode 30A is electrically connected to the voltage application unit 12, and the second through-electrode 30B is electrically connected to the detection unit 14. The detector 1 is manufactured through these processes.

Operation of Detection Device

Next, an operation of the detection device 10 will be described.

When the radiation R is incident on the detection device 10, the radiation R is incident on each of the semiconductor layers 20 stacked in the thickness direction Z.

The radiation R incident within the semiconductor layer 20 reaches the electrode regions 24, and thus, electrons are generated in the electrode regions 24 by the photoelectric effect of the irradiation of the radiation R. The electrons generated in the electrode regions 24 move in the cross direction X by the electric field produced in the cross direction X by the voltage application to the electrode regions 24. Specifically, electron-hole pairs are generated within the semiconductor layer 20 by the electrons generated in the electrode regions 24. Holes in the electron-hole pairs generated within the semiconductor layer 20 move to one side (for example, the second through-electrode 30B side) in the cross direction X, and the electrons move to the other side (for example, the first through-electrode 30A side) in the cross direction X.

Accordingly, the electric charges generated within the semiconductor layer 20 by the irradiation of the radiation R move in the cross direction X within the semiconductor layer 20. When the semiconductor region 26 is made of a material that converts the energy of the radiation R into the energy of the electric charges, the electric charges generated from the electrode regions 24 can be amplified and moved in the cross direction X. Thus, it is possible to amplify the intensity of the output signal.

The detection unit 14 detects the output signal representing the amount of electric charges output from the electrode regions 24 of the plurality of semiconductor layers 20 stacked in the thickness direction Z.

As described above, the detection device 10 of the present embodiment includes the plurality of semiconductor layers 20 stacked in the thickness direction Z. Each of the semiconductor layers 20 includes the plurality of electrode regions 24 and the semiconductor region 26. The plurality of electrode regions 24 is arranged at the intervals in the cross direction X crossing the thickness direction Z. The plurality of electrode regions 24 generates the electric charges by the photoelectric effect of the irradiation of the radiation R, and produces the electric field in the cross direction X by the voltage application. The semiconductor region 26 is formed at least between the electrode regions 24 adjacent to one another in the cross direction X.

Conventionally, there is a known configuration in which the thickness of the semiconductor layer between the electrodes arranged on an upstream side and a downstream side in an incident direction of the radiation R is increased in order to improve the detection efficiency of the high-energy electromagnetic radiation such as X-rays and γ-rays contained in the radiation R. However, as the semiconductor layer becomes thicker, the accuracy of the detector becomes decreased. It is because the output signal magnitude depends on the position in the thickness direction where the electric charges are generated by the energy transferred from the radiation R.

On the other hand, when the thickness of the semiconductor layer is simply decreased, electric capacitance between the electrodes (that is, an electric field direction) arranged at both end portions of the semiconductor layer in the thickness direction is increased (electric capacitance= area/thickness). When the electric capacitance is increased, an operation of the detection unit such as an amplifier circuit becomes unstable, and thus, noise is increased. As a result, the detection accuracy may be decreased.

Considering above, in the semiconductor layer 20 of the detection device 10 of the present embodiment, the plurality of electrode regions 24 is arranged at the intervals in the cross direction X crossing the thickness direction Z, and the electric field in the cross direction X is applied by the voltage application. Therefore, in the detection device 10 of the present embodiment, it is possible to suppress the electric capacitance between the electrodes adjacent to one another in the electric field direction (between the electrodes of the first electrode region 24A and the second electrode region 24B). Thus, the detection device 10 of the present embodiment can reduce noise included in the output signal.

The detection device 10 of the present embodiment is the stacked body in which the plurality of semiconductor layers 20 having the aforementioned configuration is stacked in the thickness direction Z.

Thus, the detection device 10 of the present embodiment is able to detect the high-energy electromagnetic radiation such as X-rays and γ-rays, and also able to suppress the generation of the difference in the detection sensitivity in the thickness direction Z.

Therefore, the detection device 10 of the present embodiment is capable of improving the detection accuracy of the electromagnetic radiation.

The detection device 10 of the present embodiment is also capable of improving the detection efficiency of the electromagnetic radiation.

Second Embodiment

In the present embodiment, a configuration in which a plurality of semiconductor blocks whose numbers of stacked semiconductor layers 20 are different is stacked in the thickness direction Z will be described.

Figure 3:
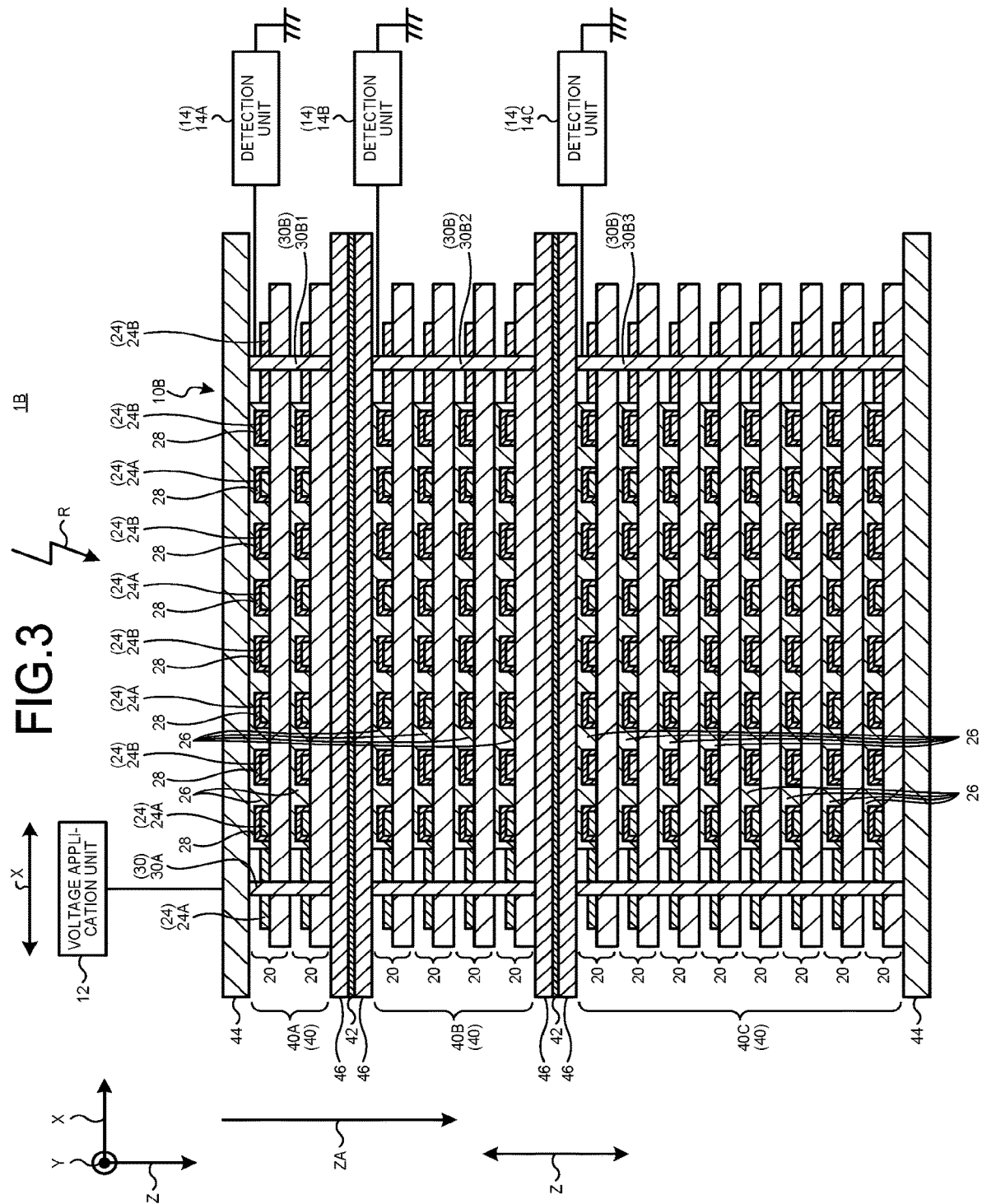
FIG. 3 is a schematic diagram of the detector.

FIG. 3 is a schematic diagram illustrating an example of a detector 1B of the present embodiment. In the present embodiment, the same members or portions having the same functions as those in the first embodiment may be denoted by the same reference numerals, and the description thereof may be omitted.

The detector 1B includes a detection device 10B, a voltage application unit 12, and a detection unit 14. The detection device 10B, the voltage application unit 12, and the detection unit 14 are electrically connected. The voltage application unit 12 and the detection unit 14 are the same as those in the first embodiment.

The detection device 10B is a stacked body in which a plurality of semiconductor blocks 40 is stacked in the thickness direction Z.

FIG. 3 illustrates a configuration in which three semiconductor blocks 40 (a semiconductor block 40A, a semiconductor block 40B, and a semiconductor block 40C) are stacked, for example. The number of semiconductor blocks 40 constituting the detection device 10B is not limited to three, and can be two, or four or more.

Each of the plurality of semiconductor blocks 40 constituting the detector 1B is a stacked body in which the plurality of semiconductor layers 20 is stacked. The semiconductor layer 20 included in each of the plurality of semiconductor blocks 40 is the same as that in the first embodiment.

The plurality of semiconductor blocks 40 is different from each other in the number of stacked semiconductor layers 20. Specifically, in the detection device 10B, the semiconductor blocks 40 are arranged from the upstream side to the downstream side in ascending order of the number of stacked semiconductor layers 20 in the incident direction of the radiation R (arrow ZA direction, and hereinafter, referred to as an incident direction ZA).

In FIG. 3, an example is illustrated such that the semiconductor block 40A, the semiconductor block 40B, and the semiconductor block 40C are stacked in this order from the upstream side to the downstream side in the incident direction ZA of the radiation R in the detection device 10B. The semiconductor block 40A is a stacked body of two semiconductor layers 20. The semiconductor block 40B is a stacked body of four semiconductor layers 20. The semiconductor block 40C is a stacked body of the semiconductor block 40B and eight semiconductor layers 20.

In the detection device 10B, the semiconductor blocks 40 can be arranged from the upstream side to the downstream side in the incident direction ZA of the radiation R in ascending order of the number of stacked semiconductor layers 20. The number of stacked semiconductor layers 20 of the semiconductor block 40 is not limited to that illustrated in FIG. 3.

The detection device 10B preferably has a configuration in which the plurality of semiconductor blocks 40 is arranged via separation substrates 46 between a pair of sealing substrates 44. The sealing substrates 44 are substrates that seal the plurality of semiconductor blocks 40. For example, the sealing substrates 44 may be made of the same material as that of the substrate 22. The separation substrates 46 are substrates that separate the semiconductor blocks 40 adjacent to one another in the thickness direction Z. For example, the separation substrates 46 may be made of the same material as that of the substrate 22.

A metal layer 42 is preferably provided between the semiconductor blocks 40 adjacent to one another in the thickness direction Z.

A constituent material of the metal layer 42 can be a material having a function of absorbing low-energy electromagnetic radiation and transmitting high-energy electromagnetic radiation. For example, the metal layer 42 is preferably made of a heavy metal such as lead. It is assumed that the metal layer 42 is grounded.

In the present embodiment, the voltage application unit 12 is electrically connected to the first through-electrode 30A. The first through-electrode 30A is only required to be electrically connected to the first electrode region 24A of the semiconductor layer 20 of each of the plurality of semiconductor blocks 40.

A variable resistor can be inserted between the voltage application unit 12 and each of the plurality of semiconductor blocks 40 (the semiconductor block 40A, the semiconductor block 40B, and the semiconductor block 40C) so that an applied voltage can be changed for each semiconductor block 40.

The detector 1B includes second through-electrodes 30B (a second through-electrode 30B1, a second through-electrode 30B2, and a second through-electrode 30B3) for each semiconductor block 40. The second through-electrode 30B1, the second through-electrode 30B2, and the second through-electrode 30B3 are electrically insulated from each other.

The second through-electrode 30B1 is electrically connected to the second electrode region 24B of each of the semiconductor layers 20 included in the semiconductor block 40A. The second through-electrode 30B2 is electrically connected to the second electrode region 24B of each of the semiconductor layers 20 included in the semiconductor block 40B. The second through-electrode 30B3 is electrically connected to the second electrode region 24B of each of the semiconductor layers 20 included in the semiconductor block 40A.

The detector 1B includes detection units (detection circuits) 14, that is, a detection unit 14A, a detection unit 14B, and a detection unit 14C, for each semiconductor block 40. The detection unit 14A is electrically connected to the second electrode region 24B of the semiconductor layer 20 included in the semiconductor block 40A via the second through-electrode 30B1. The detection unit 14B is electrically connected to the second electrode region 24B of the semiconductor layer 20 included in the semiconductor block 40B via the second through-electrode 30B2. The detection unit 14C is electrically connected to the second electrode region 24B of the semiconductor layer 20 included in the semiconductor block 40C via the second through-electrode 30B3.

Accordingly, the detector 1B is configured to detect the output signal for each semiconductor block 40.

Operation of Detection Device

Next, an operation of the detection device 10B will be described.

The radiation R is irradiated to the detection device 10B. The radiation R applied to the detection device 10B is incident on the plurality of semiconductor blocks 40 (the semiconductor block 40A, the semiconductor block 40B, and the semiconductor block 40C) in order.

In the detection device 10B, the semiconductor blocks 40 are arranged in ascending order of the number of stacked semiconductor layers 20 from the upstream side to the downstream side in the incident direction ZA of the radiation R. Thus, the radiation R is initially incident on the semiconductor block 40A having the smallest number of stacked semiconductor layers 20. The radiation R is subsequently incident on the semiconductor block 40B having a larger number of stacked semiconductor layers 20 than the semiconductor block 40A. The radiation R is finally incident on the semiconductor block 40C having the largest number of stacked semiconductor layers 20.

Thus, lower-energy electromagnetic radiation contained in the radiation R is detected by the semiconductor block 40 (for example, the semiconductor block 40A) arranged on the upstream side in the incident direction ZA of the radiation R. Higher-energy electromagnetic radiation contained in the radiation R is detected by the semiconductor block 40 (for example, the semiconductor block 40C) arranged on the downstream side in the incident direction ZA of the radiation R. Thus, the higher-energy electromagnetic radiations are detected in order from the semiconductor block 40A arranged on the upstream side in the incident direction ZA to the semiconductor block 40C arranged on the downstream side in the incident direction ZA.

Therefore, it is possible to detect the output signals of the higher-energy electromagnetic radiations in order of the detection unit 14A, the detection unit 14B, and the detection unit 14C.

As described above, the detection device 10B of the present embodiment includes the plurality of semiconductor blocks 40 whose numbers of stacked semiconductor layers 20 are different. The plurality of semiconductor blocks 40 is stacked in the thickness direction Z, and the number of stacked semiconductor layers 20 is increased from the upstream side to the downstream side in the incident direction ZA of the radiation R.

Thus, the detection device 10B of the present embodiment is able to detect the electromagnetic radiations having different energies from each other by the plurality of semiconductor blocks 40, and can perform energy spectroscopy.

Therefore, the detection device 10B of the present embodiment is capable of implementing the energy spectroscopy in addition to the effects of the aforementioned embodiment.

Figure 4:
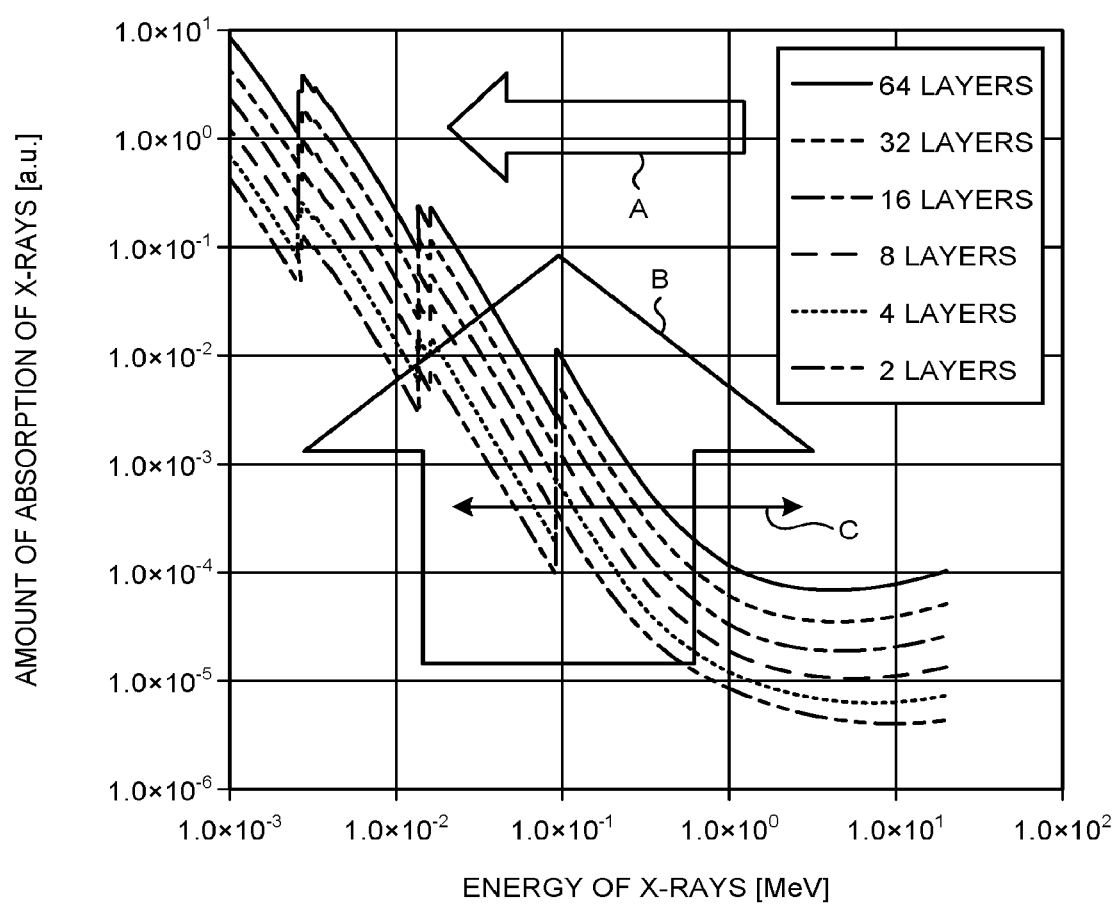
FIG. 4 is a diagram illustrating a relationship between the number of stacked semiconductor layers and the amount of absorption of energy of irradiated X-rays.

FIG. 4 is a diagram illustrating a relationship between the number of stacked semiconductor layers 20 and the amount of absorption of the energy of the irradiated X-rays. A vertical axis in FIG. 4 represents the amount of absorption of the X-rays by the semiconductor layer 20. A horizontal axis of FIG. 4 represents the energy of the X-rays applied to the semiconductor layer 20. In FIG. 4, the semiconductor layers 20 each having a thickness of 10 μm are prepared as the semiconductor layer 20. A bismuth electrode (thickness of 500 nm) is used for the electrode region 24, and an organic semiconductor is used for the semiconductor region 26. The thickness of the semiconductor region 26 is 10 μm.

As illustrated in FIG. 4, it can be seen that the amount of absorption of the X-rays having a small energy is large even when the number of stacked semiconductor layers 20 is small (see arrow A). It can also be seen that the amount of absorption of the X-rays is increased as the number of stacked semiconductor layers 20 is increased (see arrow B). It can also be seen that these tendencies are also observed in an energy region (arrow C region) generally used for detecting the X-rays.

As described above, in the detection device 10B of the present embodiment, the semiconductor blocks 40 are stacked in the thickness direction Z, and are arranged in ascending order of the number of stacked semiconductor layers 20 from the upstream side to the downstream side in the incident direction ZA of the radiation R. Thus, the detection device 10B of the present embodiment can detect the low-energy electromagnetic radiation in the semiconductor block 40 disposed on the upstream side in the incident direction ZA, and can detect the higher-energy electromagnetic radiation in the semiconductor block 40 disposed on the downstream side in the incident direction ZA. Thus, the detection device 10B of the present embodiment can realize the energy spectroscopy.

Furthermore, the metal layer 42 is preferably provided between the semiconductor blocks 40. The metal layer 42 is provided, and thus, an energy difference of the electromagnetic radiations contained in the radiation R that reaches each of the semiconductor blocks 40 adjacent to the incident direction ZA of the radiation R can be increased. Thus, a difference (contrast) can be generated in an energy range of the electromagnetic radiation detected between the semiconductor blocks 40 adjacent to one another in the incident direction ZA of the radiation R.

Modification Example

Figure 5:
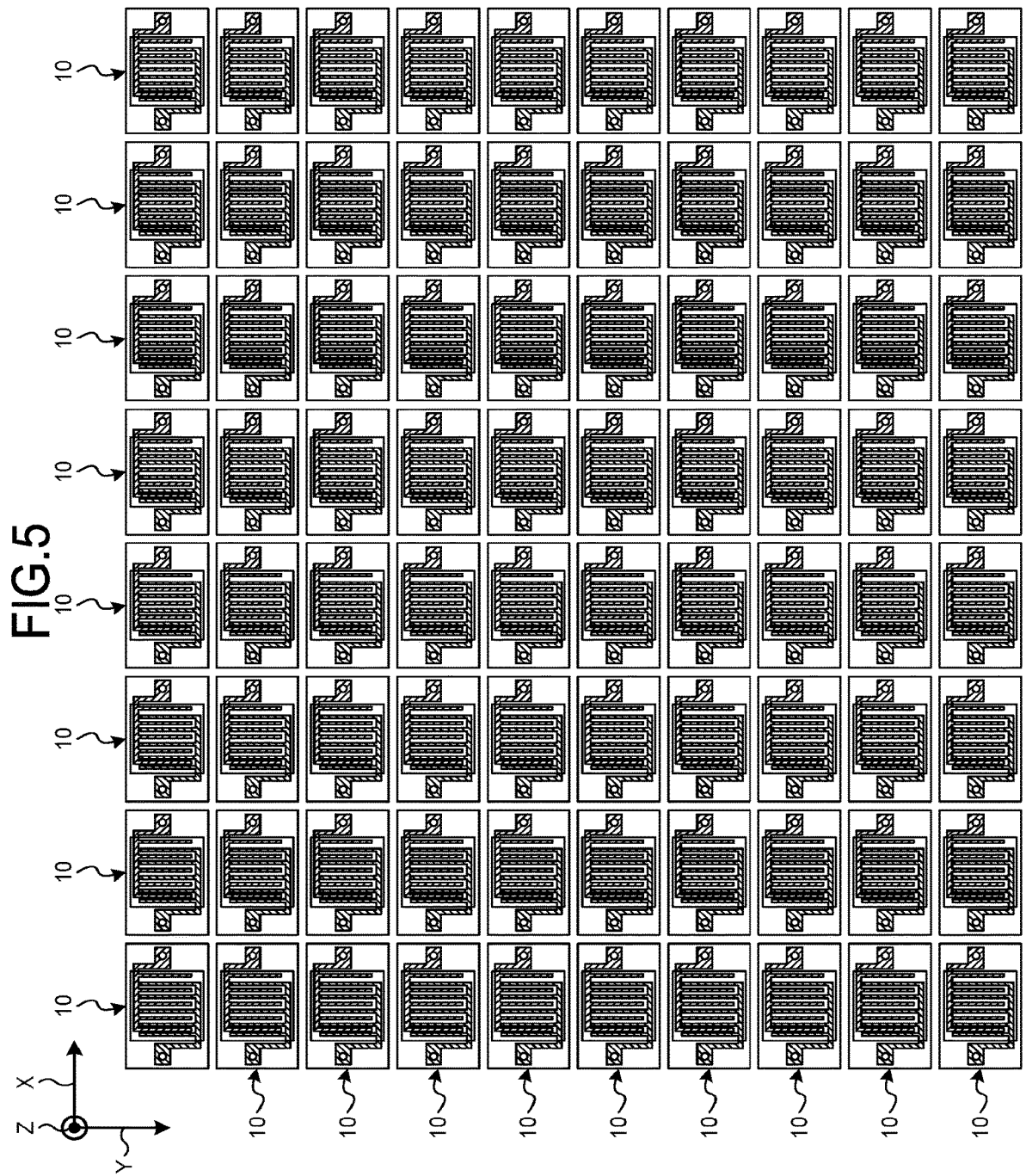
FIG. 5 is a schematic diagram illustrating an example of the detector.

FIG. 5 is a schematic diagram illustrating an example of a detector 1C.

The detector 1C is configured such that the plurality of the detection devices 10 described in the aforementioned embodiments is arranged along the two-dimensional plane (X-Y plane) orthogonal to the thickness direction Z. The detector 1C includes the voltage application unit 12 and the detection unit 14 (not illustrated in FIG. 5), as in the aforementioned embodiment.

In this case, the plurality of detection devices 10 can be divided into a plurality of regions along the X-Y plane, and the detection unit 14 can be provided for each region. This region is, for example, the aforementioned detection unit region (for example, a region for one pixel). With this configuration, the output signal can be detected for each detection unit region.

Furthermore, a variable resistor can be inserted between the voltage application unit 12 and the first electrode region 24A of each of the plurality of detection unit regions so that the applied voltage can be changed for each detection unit region.

The detector 1C can be configured such that the plurality of detection devices 10B is arranged along the two-dimensional plane (X-Y plane) orthogonal to the thickness direction Z instead of the detection devices 10.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A detection device comprising:
a plurality of semiconductor layers stacked in a thickness direction, each including a plurality of electrode regions and a semiconductor region,
the plurality of electrode regions being: arranged at intervals in a cross direction crossing the thickness direction; configured to generate electric charges by a photoelectric effect of irradiation of radiation; and configured to produce an electric field in the cross direction by voltage application,
the semiconductor region being provided at least between the electrode regions adjacent to one another in the cross direction.

2. The device according to claim 1, wherein three or more of the plurality of semiconductor layers are stacked.

3. The device according to claim 1, wherein the semiconductor region is an organic semiconductor region that converts energy of the radiation into electric charges.

4. The device according to claim 1, wherein
each of the plurality of semiconductor layers further includes insulating regions, and
each of the plurality of electrode regions is configured such that at least part of a surface of the corresponding electrode region facing the other electrode region adjacent in the cross direction is covered by the insulating region.

5. The device according to claim 1, wherein the plurality of electrode regions are arranged in a single layer in the thickness direction within a corresponding one of the plurality of semiconductor layers.

6. The device according to claim 1, wherein each of the plurality of electrode regions is made of a heavy element or an alloy of the heavy element.

7. The device according to claim 1, wherein the plurality of electrode regions are configured such that a first electrode region and a second electrode region having different potentials from one another are alternately arranged at an interval in the cross direction.

8. The device according to claim 7, wherein
the first electrode region is a first electrode line pattern being continuous along a two-dimensional plane in the cross direction, and
the second electrode region is a second electrode line pattern being continuous along the two-dimensional plane.

9. The device according to claim 7, wherein the first electrode region and the second electrode region is different in at least part of constituent materials.

10. The device according to claim 1, wherein potentials of the electrode regions arranged at an overlapping position in a plane view between the semiconductor layers are the same.

11. The device according to claim 1, further comprising a plurality of semiconductor blocks whose numbers of stacked semiconductor layers are different, wherein
the plurality of semiconductor blocks are stacked in the thickness direction, and
the plurality of semiconductor blocks are arranged in ascending order of the number of stacked semiconductor layers from an upstream side to a downstream side in an incident direction of the radiation.

12. The device according to claim 11, further comprising metal layers, each being arranged between the semiconductor blocks.

13. A detector comprising:
the detection device according to claim 1;
a voltage application circuit configured to apply voltages to the plurality of electrode regions of each of the plurality of semiconductor layers; and
a detection circuit configured to detect output signals output from the plurality of electrode regions.

14. The detector according to claim 13, wherein the voltage application circuit applies the voltages to the electrode regions in each of the plurality of semiconductor layers such that the potentials of the electrode regions adjacent to one another in the cross direction are different.

15. The detector according to claim 13, wherein the voltage application circuit applies the voltages to the electrode regions arranged in an overlapping position in the plane view between the semiconductor layers stacked in the thickness direction such that the corresponding electrode regions have the same potential.

* * * * *